(12) United States Patent
Chang et al.

(10) Patent No.: US 7,289,320 B2
(45) Date of Patent: Oct. 30, 2007

(54) ELECTRONIC DEVICE WITH WATERPROOF AND HEAT-DISSIPATING STRUCTURE

(75) Inventors: Yung-Cheng Chang, Taoyuan Hsien (TW); Yin-Yuan Chen, Taoyuan Hsien (TW); Chien-Feng Chuang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 145 days.

(21) Appl. No.: 11/180,769

(22) Filed: Jul. 13, 2005

(65) Prior Publication Data

US 2006/0198104 A1 Sep. 7, 2006

(30) Foreign Application Priority Data

Mar. 3, 2005 (TW) .............................. 94106496 A

(51) Int. Cl.
*H05K 7/20* (2006.01)

(52) U.S. Cl. ............... 361/690; 361/695; 361/714; 165/122; 165/165; 454/184

(58) Field of Classification Search ........ 361/690–695, 361/697, 704, 707, 719, 720, 724, 727; 174/35 GC, 174/35 R, 17 R, 17 VA, 16.1, 151, 16.3, 174/252, 254; 220/4.02, 428; 248/632; 218/105, 106, 109; 307/150; 165/121, 120, 165/122, 185, 104.33, 104.34; 454/184, 454/193

See application file for complete search history.

(56) References Cited

U.S. PATENT DOCUMENTS

| 4,949,218 | A | * | 8/1990 | Blanchard et al. ......... 361/696 |
| 5,689,403 | A | * | 11/1997 | Robertson et al. ......... 361/695 |
| 5,832,988 | A | * | 11/1998 | Mistry et al. .............. 165/103 |
| 6,081,425 | A | * | 6/2000 | Cheng ....................... 361/704 |
| 6,101,090 | A | * | 8/2000 | Gates ........................ 361/690 |
| 6,359,779 | B1 | * | 3/2002 | Frank et al. ............... 361/687 |
| 6,430,042 | B1 | * | 8/2002 | Ohashi et al. ............. 361/687 |
| 6,588,497 | B1 | * | 7/2003 | Glezer et al. ............... 165/84 |
| 6,877,551 | B2 | * | 4/2005 | Stoller ........................ 165/47 |
| 7,027,300 | B2 | * | 4/2006 | Lord .......................... 361/695 |
| 2004/0237570 | A1 | * | 12/2004 | Wahlberg et al. ............ 62/407 |

FOREIGN PATENT DOCUMENTS

JP 02003209375 A * 7/2003

* cited by examiner

*Primary Examiner*—Michael Datskovskiy

(57) ABSTRACT

An electronic device includes a housing, a spacing structure, a printed circuit board and a fan. The housing has first and second openings. The spacing structure is arranged within the housing for partitioning a space within the housing into an air channel and a receptacle. The air channel is in communication with the first and second openings. The printed circuit board is disposed within the receptacle. The fan is disposed within the air channel for inhaling ambient air via the first opening and exhausting the air via the second opening so as to dissipate heat outside the electronic device.

20 Claims, 7 Drawing Sheets

ELECTRONIC DEVICE WITH WATERPROOF AND HEAT-DISSIPATING STRUCTURE

FIELD OF THE INVENTION

The present invention relates to an electronic device, and more particularly to an electronic device with a waterproof and heat-dissipating structure.

BACKGROUND OF THE INVENTION

With increasing integration of integrated circuits, electronic devices such as power adapters and power supply apparatuses are developed toward minimization. As the volume of the electronic device is decreased, the problem associated with heat dissipation becomes more serious. Take a power adapter for example. The conventional power adapter comprises an upper housing and a lower housing, which are made of plastic materials and cooperatively defines a closed space for accommodating a printed circuit board. When the power adapter operates, the electronic components on the printed circuit board thereof may generate energy in the form of heat, which is readily accumulated within the closed space and usually difficult to dissipate away. If the power adapter fails to transfer enough heat to ambient air, the elevated operating temperature may result in damage of the electronic components, a breakdown of the whole power adapter or reduced power conversion efficiency.

Referring to FIG. 1, a schematic cross-sectional view of a conventional power adapter is illustrated. The power adapter 1 comprises an upper housing 11, a lower housing 12, a printed circuit board 13, a power input terminal (not shown) and a power output terminal 14. A closed space is defined between the upper housing 11 and the lower housing 12 for accommodating therein the printed circuit board 13. Many electronic components 131 are mounted on the printed circuit board 13. In order to remove most heat generated from the electronic components 131, several heat sinks 132 are usually provided on the printed circuit board 13. In addition, some electronic components 131 are coupled to the heat sinks 132 by screwing or riveting connection, thereby facilitating heat dissipation.

The heat dissipation mechanism of the power adapter 1 comprises conducting heat generated from the electronic components 131 to the heat sinks 132, radiating heat from the surfaces of the heat sinks 132 to the closed space of the power adapter 1, transferring heat from the closed space to the upper housing 11 and the lower housing 12 through air, and afterwards performing heat-exchange with the surrounding of the power adapter 1. Since the power adapter is developed toward minimization and designed to have higher power, the passive heat dissipation mechanism described above is not satisfactory.

For enhancing heat-dissipation efficiency, the heat generated from the internal electronic components of the power adapter 1 should be actively dissipated away the power adapter 1. In order to be applied to most operating statues and environments, the housing of the power adapter 1 should have additional openings such that the space defined by the housing is communicated with external ambient air. Under this circumstance, the power adapter 1 fails to be operated in humid surroundings or outdoors due to the poor waterproof properties. If the power adapter 1 having the active heat dissipation mechanism is used in the humid surroundings or outdoors, the electronic components may be damaged or shorted in case of contacting with water.

In views of the above-described disadvantages resulted from the prior art, the applicant keeps on carving unflaggingly to develop an electronic device with a waterproof and heat-dissipating structure according to the present invention through wholehearted experience and research.

SUMMARY OF THE INVENTION

It is an object of the present invention to provide an electronic device with a waterproof and heat-dissipating structure for facilitating heat dissipation by using an active heat dissipation mechanism.

Another object of the present invention is to provide an electronic device with a waterproof and heat-dissipating structure so as to enhance efficiency of heat dissipation and application thereof.

In accordance with a first aspect of the present invention, there is provided an electronic device with a waterproof and heat-dissipating structure. The electronic device comprises a housing, a spacing structure, a printed circuit board and a fan. The housing has first and second openings. The spacing structure is arranged within the housing for partitioning a space within the housing into an air channel and a receptacle. The air channel is in communication with the first and second openings. The printed circuit board is disposed within the receptacle. The fan is disposed within the air channel for inhaling ambient air via the first opening and exhausting the air via the second opening so as to dissipate heat outside the electronic device.

Preferably, the electronic device is a power adapter or a charger.

In an embodiment, the housing comprises an upper housing and a lower housing.

In an embodiment, the air channel is disposed between an inner wall of the housing and the spacing structure.

In an embodiment, the housing is made of plastic material.

In an embodiment, the spacing structure comprises a heat-dissipating plate, two flanges and two adhesive layers. The two flanges are parallel with each other and extended from an inner wall of the housing as to form a rectangular trench therebetween. The two adhesive layers couple the two flanges to bilateral edges of the heat-dissipating plate, respectively, thereby sealing the rectangular trench defined between the two flanges and partitioning the space within the housing into the air channel and the receptacle.

In an embodiment, the spacing structure further comprises a first rib extended from an inner wall of the housing, adjacent to the first opening and attached onto one side edge of the heat-dissipating plate via the adhesive layer.

In an embodiment, the first rib is integrally formed with the housing.

In an embodiment, the spacing structure further comprises a second rib extended from an inner wall of the housing, adjacent to the second opening and attached onto the other side edge of the heat-dissipating plate via the adhesive layer.

In an embodiment, the second rib is integrally formed with the housing.

In an embodiment, the spacing structure comprises a heat-dissipating plate, two flanges and a fixing frame. The two flanges are extended from an inner wall of the housing to form a trench therebetween, wherein the two flanges have indentations for receiving and supporting the bilateral edges of the heat-dissipating plate. The fixing frame has a first portion and a second portion, wherein the first portion biases the bilateral edges of the heat-dissipating plate and the second portion is coupled to the two flanges by supersonic welding, thereby sealing the trench defined between the two flanges and partitioning the space within the housing into the air channel and the receptacle.

In an embodiment, the spacing structure further comprises a first rib extended from an inner wall of the housing, adjacent to the first opening and having an indentation for receiving and supporting one side edge of the heat-dissipating plate.

In an embodiment, the first portion of the fixing frame biases the side edge of the heat-dissipating plate, and the second portion of the fixing frame is coupled to the first rib by supersonic welding.

In an embodiment, the first rib is integrally formed with the housing.

In an embodiment, the spacing structure further comprises a second rib extended from an inner wall of the housing, adjacent to the second opening and having an indentation for receiving and supporting the other side edge of the heat-dissipating plate.

In an embodiment, the first portion of the fixing frame biases the other side edge of the heat-dissipating plate, and the second portion of the fixing frame is coupled to the second rib by supersonic welding.

In an embodiment, the second rib is integrally formed with the housing.

Preferably, the fan is a blower.

In an embodiment, the fan is disposed adjacent to the first opening or the second opening.

Preferably, the electronic device is a portable electronic device.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
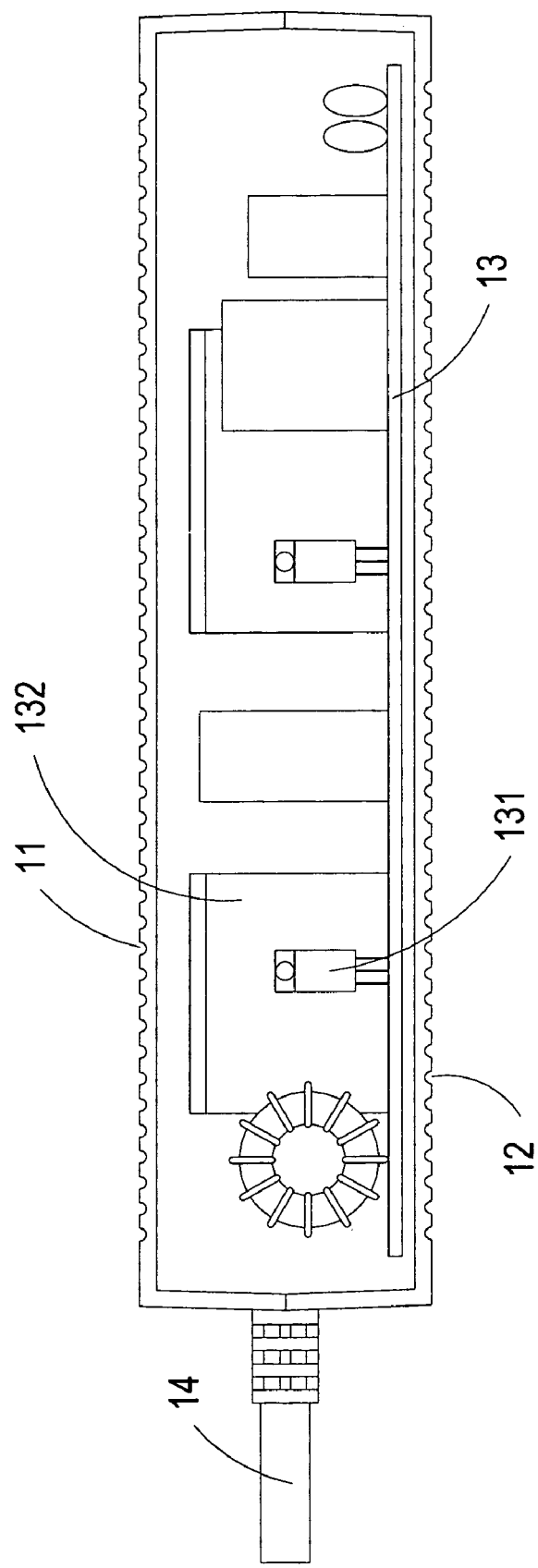
FIG. 1 is a schematic cross-sectional view of a conventional power adapter.
Figure 2:
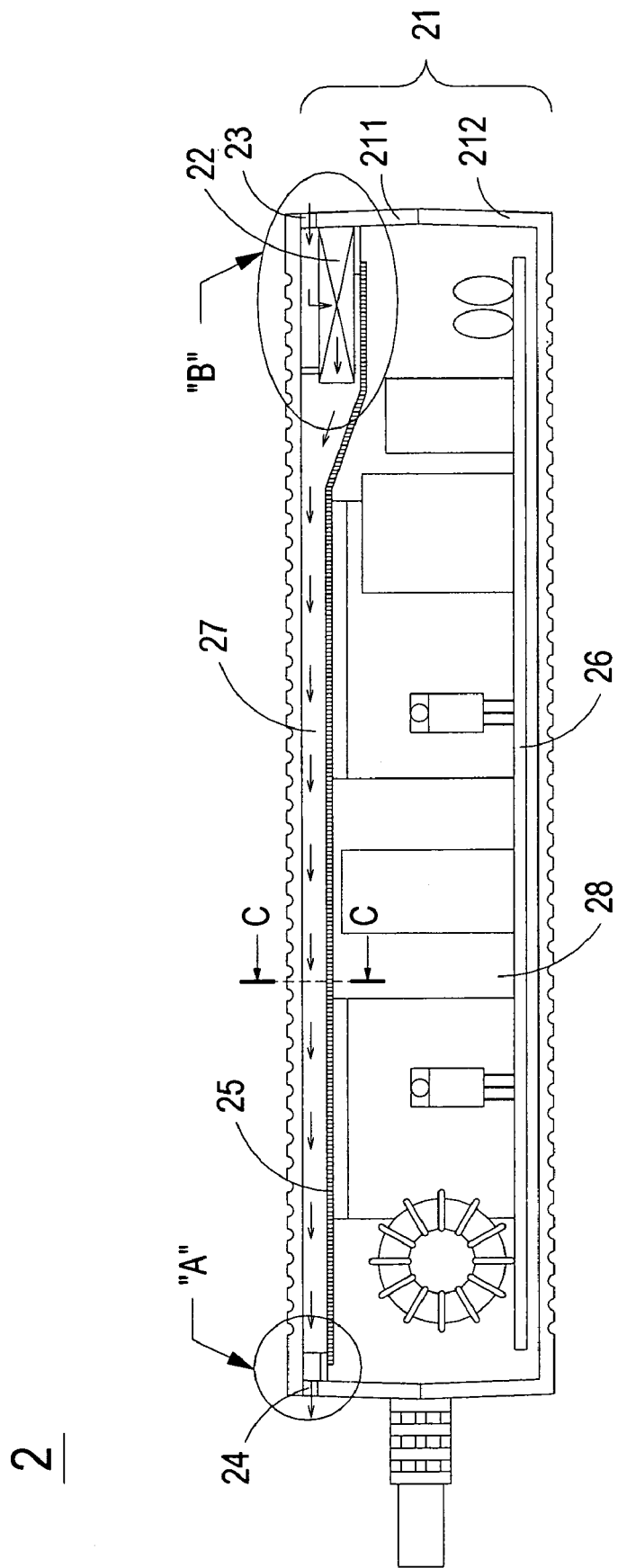
FIG. 2 is a schematic cross-sectional view of an electronic device with a waterproof and heat-dissipating structure according to a preferred embodiment of the present invention.

Referring to FIG. 2, a schematic cross-sectional view of an electronic device with a waterproof and heat-dissipating structure according to a preferred embodiment of the present invention is shown. The electronic device 2 comprises a housing 21, a fan 22, a first opening 23, a second opening 24, a spacing structure 25 and a printed circuit board 26. The first opening 23 and the second opening 24 are arranged in the housing 21. The spacing structure 25 is disposed within the housing 21 for partitioning the space within the housing 21 into an air channel 27 and a receptacle 28. The fan 22 is disposed in the air channel 27. By means of the fan 22, air is forced to flow into the air channel 27 via the first opening 23 and exhausted via the second opening 24 so as to dissipate heat generated from the electronic components on the printed circuit board 26 in accordance with an active heat dissipation mechanism. In addition, since the spacing structure 25 can separate the air channel 27 from the receptacle 28, moisture or liquid from the ambient air will no longer attack the printed circuit board 26 so as to achieve waterproof and heat-dissipating objects.

The housing 21 of the electronic device 2 may be composed of an upper housing 211 and a lower housing 212. An exemplary fan 22 is a blower adjacent to the first opening 23 or the second opening 24. The air inhaled by the fan 22 flows from the first opening 23 to the second opening 24, as indicated by the arrow shown in the drawing. Alternatively, the air inhaled by the fan 22 may flow from the second opening 24 to the first opening 23. Preferably, the first opening 23 and the second opening 24 are arranged on opposite sides of the housing 21.

The spacing structure 25 is disposed within the housing 21 for partitioning the space within the housing 21 into an air channel 27 and the receptacle 28. The air channel 27 in FIG. 2 is located at one side of the spacing structure 25. It is noted that, however, those skilled in the art will readily observe that numerous modifications and alterations of the air channel may be made while retaining the teachings of the invention. For example, the air channel may surround the inner wall of the housing 21. Accordingly, the above disclosure should be limited only by the bounds of the following claims. The spacing structure 25 of FIG. 3 and FIG. 7 comprises a heat-dissipating plate 255, two flanges 251 and 252 extended from an inner wall of the housing 21, and at least one coupling element for coupling the two flanges 251 and 252 to the heat-dissipating plate 255, thereby sealing a trench 258 defined between the two flanges 251 and 252 and partitioning the space within the housing 21 into the air channel 27 and the receptacle 28.

Figure 3:
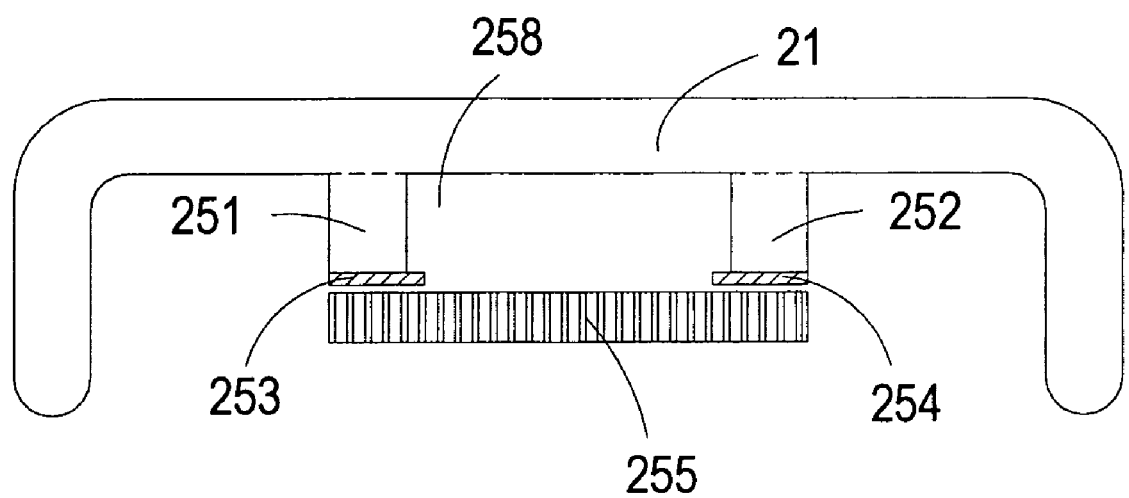
FIG. 3 is a cross-sectional view illustrating the configuration of FIG. 2 along the line C-C.

Please refer to FIG. 3, which is a cross-sectional view illustrating the configuration of FIG. 2 along the line C-C. As shown in FIGS. 2 and 3, the spacing structure 25 comprises two flanges 251 and 252 parallel with each other, coupling elements, and a heat-dissipating plate 255. The coupling elements are two adhesive layers 253 and 254. The two flanges 251 and 252 are extended from an inner wall of the housing 21 so as to form a rectangular trench 258 between these two flanges 251 and 252. Via the adhesive layers 253 and 254, the flanges 251 and 252 are coupled to the bilateral edges of the heat-dissipating plate 255, respectively, thereby sealing the rectangular trench 258 defined between these two parallel flanges 251 and 252 and partitioning the space within the housing 21 into the air channel 27 and the receptacle 28.

Figure 4:
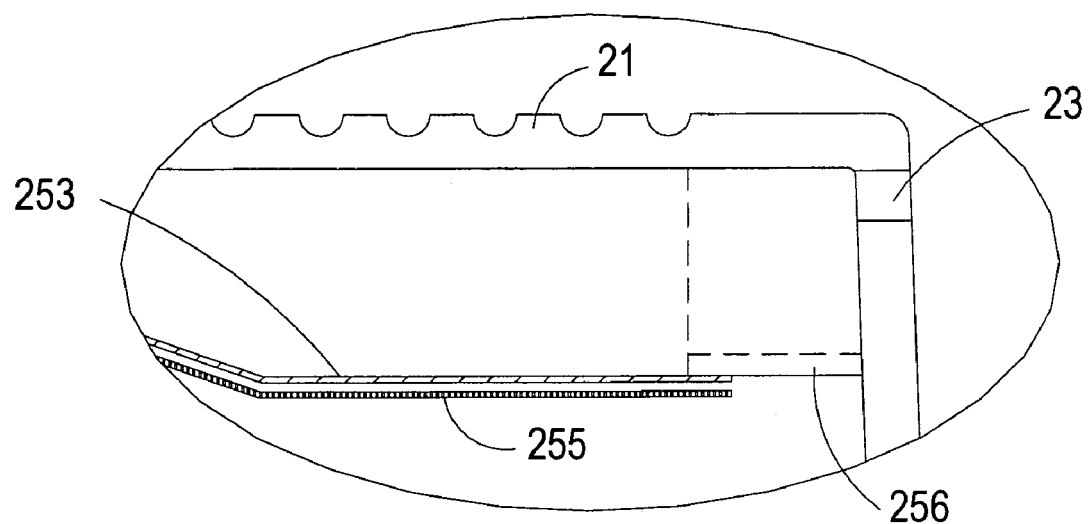
FIG. 4 is a partially enlarged view of the portion "B" of the configuration in FIG. 2.

Referring to FIG. 4, a partially enlarged view of the portion "B" in FIG. 2 is shown. In order to assure good sealing property and prevent moisture or liquid from attacking the printed circuit board 26, the spacing structure 25 is optionally provided with a first rib 256, which is extended from the inner wall of the housing 21 and adjacent to the first opening 23. The free end of the first rib 256 is attached onto one side edge of the heat-dissipating plate 255 via the adhesive layer 253 so as to avoid gap therebetween and enhance sealing property of the receptacle 28. The first rib 256 and these two flanges 251 and 252 are arranged in a shape of U-letter. It is preferred that the first rib 256 is integrally formed with the housing 21.

Figure 5:
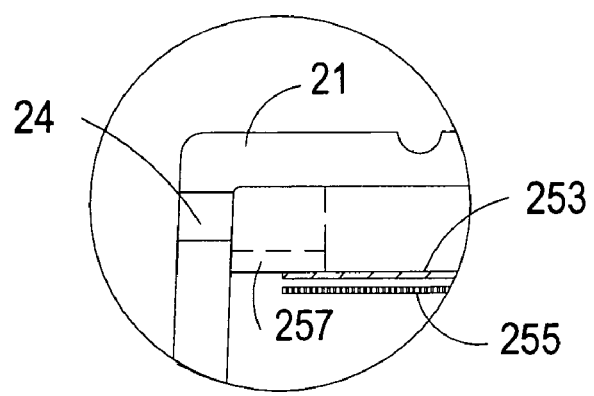
FIG. 5 is a partially enlarged view of the portion "A" of the configuration in FIG. 2.

Referring to FIG. 5, a partially enlarged view of the portion "A" in FIG. 2 is shown. In order to assure good sealing property and prevent moisture or liquid from attacking the printed circuit board 26, the spacing structure 25 is optionally provided with a second rib 257, which is extended from the inner wall of the housing 21 and adjacent to the second opening 24. The free end of the second rib 257 is attached onto the other side edge of the heat-dissipating plate 255 via the adhesive layer 253 so as to avoid gap therebetween and enhance sealing property of the receptacle 28. The second rib 257 and these two flanges 251 and 252 are also arranged in a shape of U-letter. It is preferred that the second rib 257 is integrally formed with the housing 21.

Please refer to FIG. 2 again. During operation of the electronic device 2, the electronic components mounted on the printed circuit board 26 will generate heat, which are directly conducted to the heat-dissipating plate 255 or transferred to the heat-dissipating plate 255 via convection. The heat will be transferred from the heat-dissipating plate 255 to the air channel 27, and dissipated to outside of the housing 21 in accordance with the active heat dissipation mechanism. Under this circumstance, the ambient air inhaled by the fan 22 will carry away the heat generated from the electronic components via the second opening 24. In addition, since the spacing structure 25 can separate the air channel 27 from the receptacle 28, moisture or liquid from the ambient air will no longer attack the printed circuit board 26 so as to achieve waterproof and heat-dissipating objects.

Figure 6:
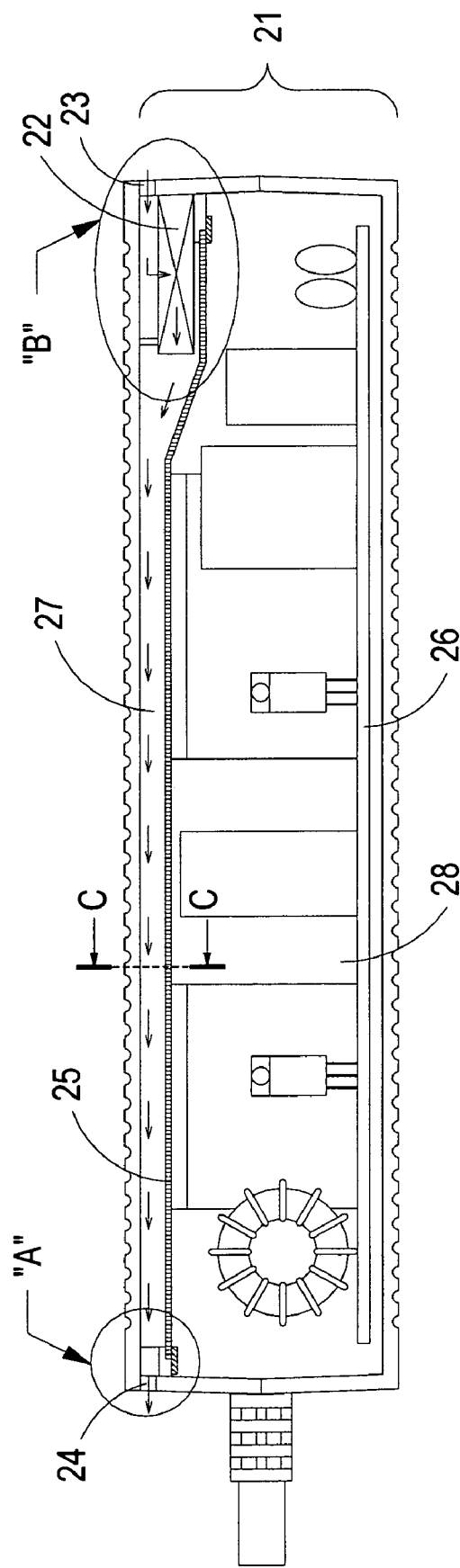
FIG. 6 is a schematic cross-sectional view of an electronic device with a waterproof and heat-dissipating structure according to another preferred embodiment of the present invention.

Referring to FIG. 6, a schematic cross-sectional view of an electronic device with a waterproof and heat-dissipating structure according to another preferred embodiment of the present invention is shown. The electronic device 2 also comprises a housing 21, a fan 22, a first opening 23, a second opening 24, a spacing structure 25 and a printed circuit board 26. The first opening 23 and the second opening 24 are arranged in the housing 21. The spacing structure 25 is disposed within the housing 21 for partitioning the space within the housing 21 into an air channel 27 and a receptacle 28. The fan 22 is disposed in the air channel 27. By means of the fan 22, air is forced to flow into the air channel 27 via the first opening 23 and exhausted via the second opening 24 so as to dissipate heat generated from the electronic components on the printed circuit board 26 in accordance with an active heat dissipation mechanism. In addition, since the spacing structure 25 can separate the air channel 27 from the receptacle 28, moisture or liquid from the ambient air will no longer attack the printed circuit board 26 so as to achieve waterproof and heat-dissipating objects.

Figure 7:
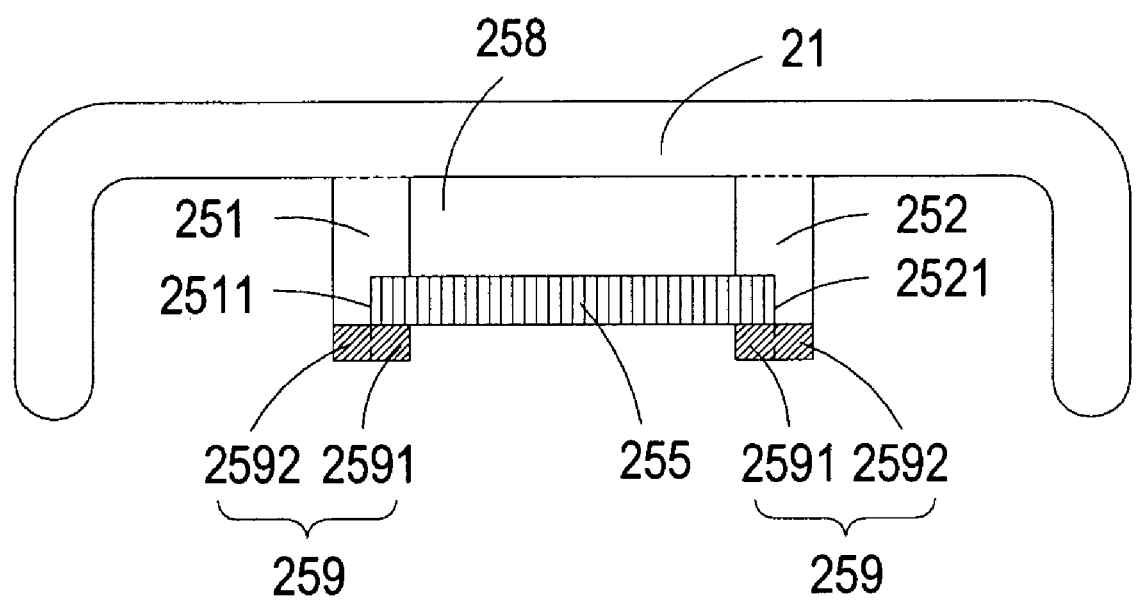
FIG. 7 is a cross-sectional view illustrating the configuration of FIG. 6 along the line C-C.

Please refer to FIG. 7, which is a cross-sectional view illustrating the configuration of FIG. 6 along the line C-C. As shown in FIGS. 6 and 7, the spacing structure 25 comprises two flanges 251 and 252, a coupling element, and a heat-dissipating plate 255. The coupling element is a fixing frame 259. The two flanges 251 and 252 are extended from an inner wall of the housing 21 so as to form a trench 258 between these two flanges 251 and 252. The flanges 251 and 252 have indentations 2511, 2521 for receiving and supporting the bilateral edges of the heat-dissipating plate 255. The fixing frame 259 can be roughly divided into two portions 2591, 2592. The first portion 2591 of the fixing frame 259 biases the bilateral edges of the heat-dissipating plate 255 so that the bilateral edges of the heat-dissipating plate 255 can be tightly received in the indentations 2511, 2521 of the flanges 251 and 252. In addition, the second portion 2592 of the fixing frame 259 is coupled to the flanges 251 and 252 by supersonic welding, thereby sealing the trench 258 defined between these two flanges 251 and 252 and partitioning the space within the housing 21 into the air channel 27 and the receptacle 28.

Figure 8:
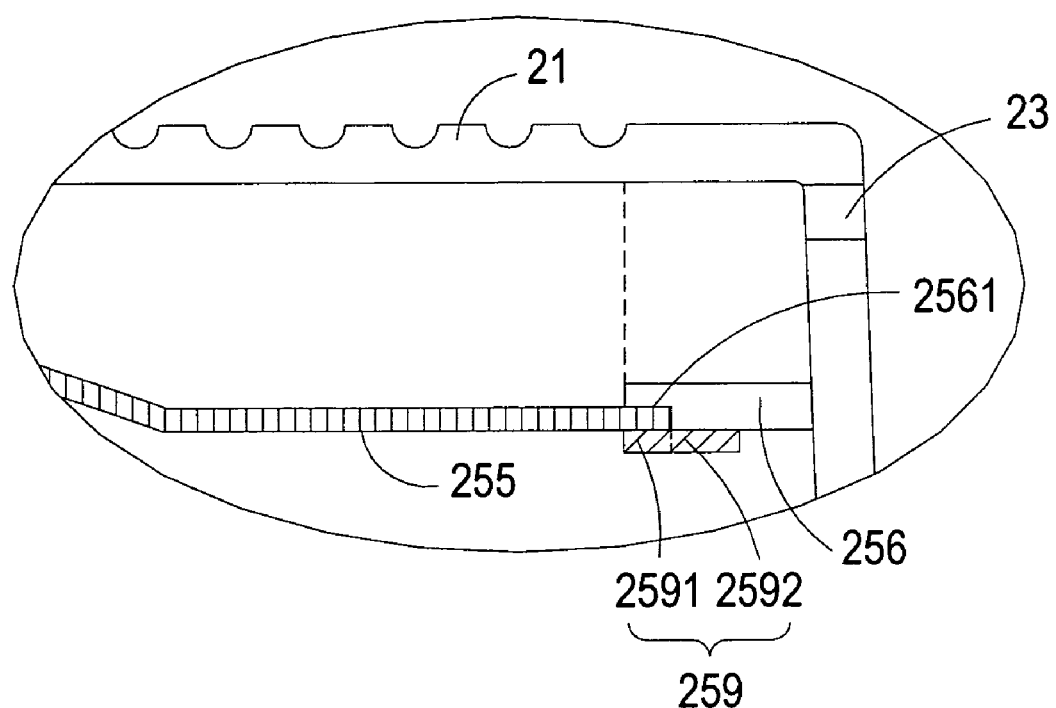
FIG. 8 is a partially enlarged view of the portion "B" of the configuration in FIG. 6.

Referring to FIG. 8, a partially enlarged view of the portion "B" in FIG. 6 is shown. In order to assure good sealing property and prevent moisture or liquid from attacking the printed circuit board 26, the spacing structure 25 is optionally provided with a first rib 256, which is extended from the inner wall of the housing 21 and adjacent to the first opening 23. The first rib 256 also has an indentation 2561 for receiving and supporting one side edge of the heat-dissipating plate 255. The first portion 2591 of the fixing frame 259 biases the side edge of the heat-dissipating plate 255 for allowing the side edge of the heat-dissipating plate 255 to be tightly received in the indentation 2561 of the first rib 256. In addition, the second portion 2592 of the fixing frame 259 is coupled to the first rib 256 by supersonic welding, thereby sealing the trench 258 defined between these two flanges 251 and 252, avoiding gap therebetween and enhancing sealing property of the receptacle 28. The first rib 256 and these two flanges 251 and 252 are arranged in a shape of U-letter. It is preferred that the first rib 256 is integrally formed with the housing 21.

Figure 9:
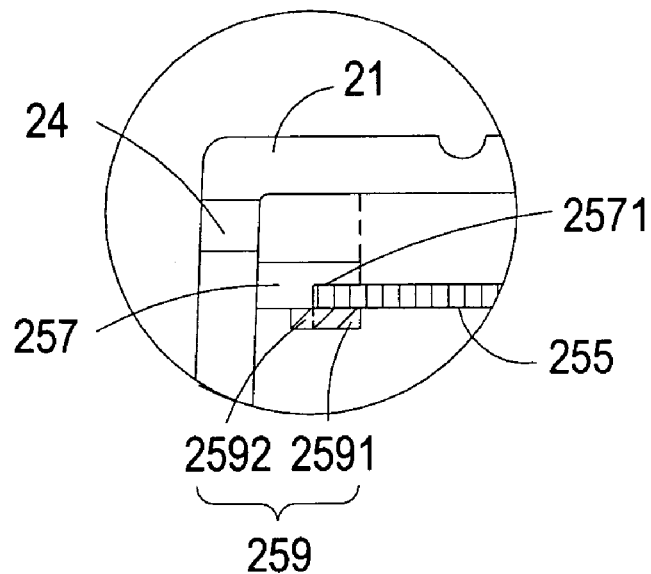
FIG. 9 is a partially enlarged view of the portion "A" of the configuration in FIG. 6.

Referring to FIG. 9, a partially enlarged view of the portion "A" in FIG. 6 is shown. In order to assure good sealing property and prevent moisture or liquid from attacking the printed circuit board 26, the spacing structure 25 is optionally provided with a second rib 257, which is extended from the inner wall of the housing 21 and adjacent to the second opening 24. The second rib 257 also has an indentation 2571 for receiving and supporting the other side edge of the heat-dissipating plate 255. The first portion 2591 of the fixing frame 259 biases the other side edge of the heat-dissipating plate 255 for allowing the other side edge of the heat-dissipating plate 255 to be tightly received in the indentation 2571 of the first rib 257. In addition, the second portion 2592 of the fixing frame 259 is coupled to the second rib 257 by supersonic welding, thereby sealing the trench 258 defined between these two flanges 251 and 252, avoiding gap therebetween and enhancing sealing property of the receptacle 28. The second rib 257 and these two flanges 251 and 252 are also arranged in a shape of U-letter. It is preferred that the second rib 257 is integrally formed with the housing 21.

Please refer to FIG. 6 again. During operation of the electronic device 2, the electronic components mounted on the printed circuit board 26 will generate heat, which are directly conducted to the heat-dissipating plate 255 or transferred to the heat-dissipating plate 255 via convection. The heat will be transferred from the heat-dissipating plate 255 to the air channel 27, and dissipated to outside of the housing 21 in accordance with the active heat dissipation mechanism. Under this circumstance, the ambient air inhaled by the fan 22 will carry away the heat generated from the electronic components via the second opening 24. In addition, since the spacing structure 25 can separate the air channel 27 from the receptacle 28, moisture or liquid from the ambient air will no longer attack the printed circuit board 26 so as to achieve waterproof and heat-dissipating objects.

The present invention is illustrated by referring to a power adapter with a waterproof and heat-dissipating structure. Nevertheless, the present invention can be applied to other electronic device that generates heat during operation. For example, the electronic device can be a portable electronic device or an outdoor electronic device. The heat-dissipating plate 255 used in the above embodiments is made of the material with high thermal conductivity, for example metallic material. In order to enhance dissipating efficiency, the housing 21 can be made of plastic material or high thermally conductive material such as metallic material. In some embodiments, the spacing structure 25 is integrally formed with the housing 21.

From the above description, the waterproof and heat-dissipating structure of the present invention is capable of enhancing heat-dissipating efficiency and preventing from moisture attack. Accordingly, the electronic device with such waterproof and heat-dissipating structure has extended life and can be operated in many environments.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device with a waterproof and heat-dissipating structure, comprising:
   a housing having first and second openings;
   a spacing structure arranged within said housing for partitioning a space within said housing into an air channel and a receptacle, said air channel being in communication with said first and second openings, wherein said spacing structure comprising:
   a heat-dissipating plate;
   two flanges extended from an inner wall of said housing as to form a trench therebetween; and
   at least one coupling element for coupling said two flanges to said heat-dissipating plate, thereby sealing said trench defined between said two flanges and partitioning said space within said housing into said air channel and said receptacle;
   a printed circuit board disposed within said receptacle; and
   a fan disposed within said air channel for inhaling ambient air via said first opening and exhausting said air via said second opening so as to dissipate heat outside said electronic device.

2. The electronic device according to claim 1 being selected from a group consisting of a power adapter and a charger.

3. The electronic device according to claim 1 wherein said housing comprises an upper housing and a lower housing.

4. The electronic device according to claim 1 wherein said air channel is disposed between an inner wall of said housing and said spacing structure.

5. The electronic device according to claim 1 wherein said housing is made of plastic material.

6. The electronic device according to claim 1 wherein said coupling elements are
   two adhesive layers for coupling said two flanges to bilateral edges of said heat-dissipating plate, respectively, thereby sealing said trench defined between said two flanges and partitioning said space within said housing into said air channel and said receptacle.

7. The electronic device according to claim 6 wherein said spacing structure further comprises a first rib extended from an inner wall of said housing, adjacent to said first opening and attached onto one side edge of said heat-dissipating plate via said adhesive layer.

8. The electronic device according to claim 7 wherein said first rib is integrally formed with said housing.

9. The electronic device according to claim 7 wherein said spacing structure further comprises a second rib extended from an inner wall of said housing, adjacent to said second opening and attached onto the other side edge of said heat-dissipating plate via said adhesive layer.

10. The electronic device according to claim 9 wherein said second rib is integrally formed with said housing.

11. The electronic device according to claim 1 wherein
    said two flanges have indentations for receiving and supporting the bilateral edges of said heat-dissipating plate; and
    said coupling element is a fixing frame having a first portion and a second portion, wherein said first portion biases the bilateral edges of said heat-dissipating plate and said second portion is coupled to said two flanges by supersonic welding, thereby sealing said trench defined between said two flanges and partitioning said space within said housing into said air channel and said receptacle.

12. The electronic device according to claim 11 wherein said spacing structure further comprises a first rib extended from an inner wall of said housing, adjacent to said first opening and having an indentation for receiving and supporting one side edge of said heat-dissipating plate.

13. The electronic device according to claim 12 wherein said first portion of said fixing frame biases said side edge of said heat-dissipating plate, and said second portion of said fixing frame is coupled to said first rib by supersonic welding.

14. The electronic device according to claim 12 wherein said first rib is integrally formed with said housing.

15. The electronic device according to claim 12 wherein said spacing structure further comprises a second rib extended from an inner wall of said housing, adjacent to said second opening and having an indentation for receiving and supporting the other side edge of said heat-dissipating plate.

16. The electronic device according to claim 15 wherein said first portion of said fixing frame biases said the other side edge of said heat-dissipating plate, and said second portion of said fixing frame is coupled to said second rib by supersonic welding.

17. The electronic device according to claim 15 wherein said second rib is integrally formed with said housing.

18. The electronic device according to claim 1 wherein said fan is a blower.

19. The electronic device according to claim 1 wherein said fan is disposed adjacent to said first opening or said second opening.

20. The electronic device according to claim 1 being a portable electronic device.

* * * * *